United States Patent [19]
Nishiura et al.

[11] Patent Number: 5,132,993
[45] Date of Patent: Jul. 21, 1992

[54] SHIFT REGISTER CIRCUIT

[75] Inventors: Haruo Nishiura; Hiroaki Azuhata, both of Tokyo, Japan

[73] Assignee: NEC Corporation, Tokyo, Japan

[21] Appl. No.: 631,348

[22] Filed: Dec. 20, 1990

[30] Foreign Application Priority Data

Dec. 20, 1989 [JP] Japan .................................. 1-332021
Dec. 20, 1989 [JP] Japan .................................. 1-332022

[51] Int. Cl.$^5$ ............................................. G11C 19/00
[52] U.S. Cl. ........................................ 377/76; 377/79; 377/81
[58] Field of Search ...................... 377/64, 106, 73, 77, 377/78, 80, 76, 72, 75, 76, 114, 115, 116, 111, 112

[56] References Cited

U.S. PATENT DOCUMENTS

3,903,490  9/1975  Sakamoto ............................ 377/114
3,989,957  11/1976  Tucci ................................. 377/116
4,366,394  12/1982  Clendening et al. ................. 377/115

Primary Examiner—Stanley D. Miller
Assistant Examiner—Sinh Tran
Attorney, Agent, or Firm—Helfgott & Karas

[57] ABSTRACT

A shift register circuit includes a logical operator which is added to an output terminal of a latch portion and takes a logical operation of input and output signals of the latch portion and outputs its result as a bit signal. The signal of a bit component is shifted to a higher order bit every half of the period of a clock signal so that a shifting speed thereof can be made two times faster than that in a conventional shift register circuit. It may be arranged such that a higher order bit section starts to output a signal after the preceding lower order bit section outputs a low level signal thereby enabling to avoid the signals outputted by the bit sections neighboring to each other becoming simultaneously intermediate values between a high level and a low level. Also, the bit sections may be cascade-connected such that each of the sections takes a logical operation of the input and output signals of the latch portion. In view of the configuration involved, the number of elements per bit can be reduced.

9 Claims, 6 Drawing Sheets

SHIFT REGISTER CIRCUIT

BACKGROUND OF THE INVENTION

The present invention relates to a shift register circuit.

A shift register circuit has been used for a scanning portion of a sample hold circuit to which is inputted video signals and which holds samples of about 60 bits.

A conventional shift register circuit of this kind generally comprises a first latch portion in which one terminal of a transfer gate is connected to an input terminal, another terminal thereof is connected to an input terminal of an inverter which is connected in anti-parallel with a clocked inverter, and an output terminal of the inverter is connected to a first cascade output terminal, and a second latch portion which has the same configuration as the first latch portion but in which clock signals inputted to a transfer gate and to a clocked inverter are anti-phase to clock signals inputted to those in the first latch portion, the first latch portion and the second latch portion being cascade-connected.

The conventional shift register circuit mentioned above uses two latch circuits per bit thereby increasing the number of elements required in the circuit. Also, in such a conventional circuit, a change of each bit value synchronizes with each rising timing of the clock signal and, therefore, one shift register having two latch portions can generate only one bit output, resulting in a slow shifting speed. Further, there exists a transient period wherein output signals by the bits neighboring to each other become an intermediate value which is not a "H" level nor a "L" level, which causes malfunction of the circuit.

SUMMARY OF THE INVENTION

It is, therefore, an object of the present invention to overcome the problems existing in the conventional arrangement and to provide an improved shift register circuit.

It is another object of the present invention to provide a shift register circuit in which the number of elements thereof is small.

It is a further object of the present invention to provide a shift register circuit in which a shifting speed is fast and malfunction is substantially avoided.

In carrying out the above and other objects of the present invention in one form, there is provided an improved shift register circuit comprising:
- a first bit section including a first latch portion which outputs a first cascade signal, and including a first NOR gate which takes a logical NOR of an input signal inputted to one terminal thereof and said first cascade signal inputted to another terminal thereof, and which outputs a NOR signal as a first bit signal; and
- a second bit section including a second latch portion and a second NOR gate which takes a logical NOR of said first bit signal inputted to one terminal thereof and a transfer output signal inputted to another terminal thereof, and which outputs a NOR signal as a second bit signal.

It may also be arranged for the shift register circuit to comprise a first bit section including a first latch portion which outputs a first latch signal, including a first NOR gate which takes a logical NOR of an input signal inputted to one terminal thereof and said first latch signal inputted to another terminal thereof, and which outputs a NOR signal as a first bit signal, and including a first cascade output terminal which outputs an inverted signal of said first latch signal as a first cascade signal, and a second bit section including a second latch portion which outputs a second latch signal, and including a second NOR gate which takes a logical NOR of said first cascade signal inputted to one terminal thereof and said second latch signal inputted to another terminal thereof, and which outputs a NOR signal as a second bit signal.

BRIEF DESCRIPTION OF THE DRAWINGS

The above and other objects, features and advantages of the present invention will be understood from the following description of preferred embodiments according to the present invention explained with reference to the accompanying drawings, in which.

PREFERRED EMBODIMENTS OF THE INVENTION

For the purpose of assisting in the understanding of the present invention, a conventional shift register circuit will first be described by making reference to FIG. 1 before the present invention is explained.

Figure 1:
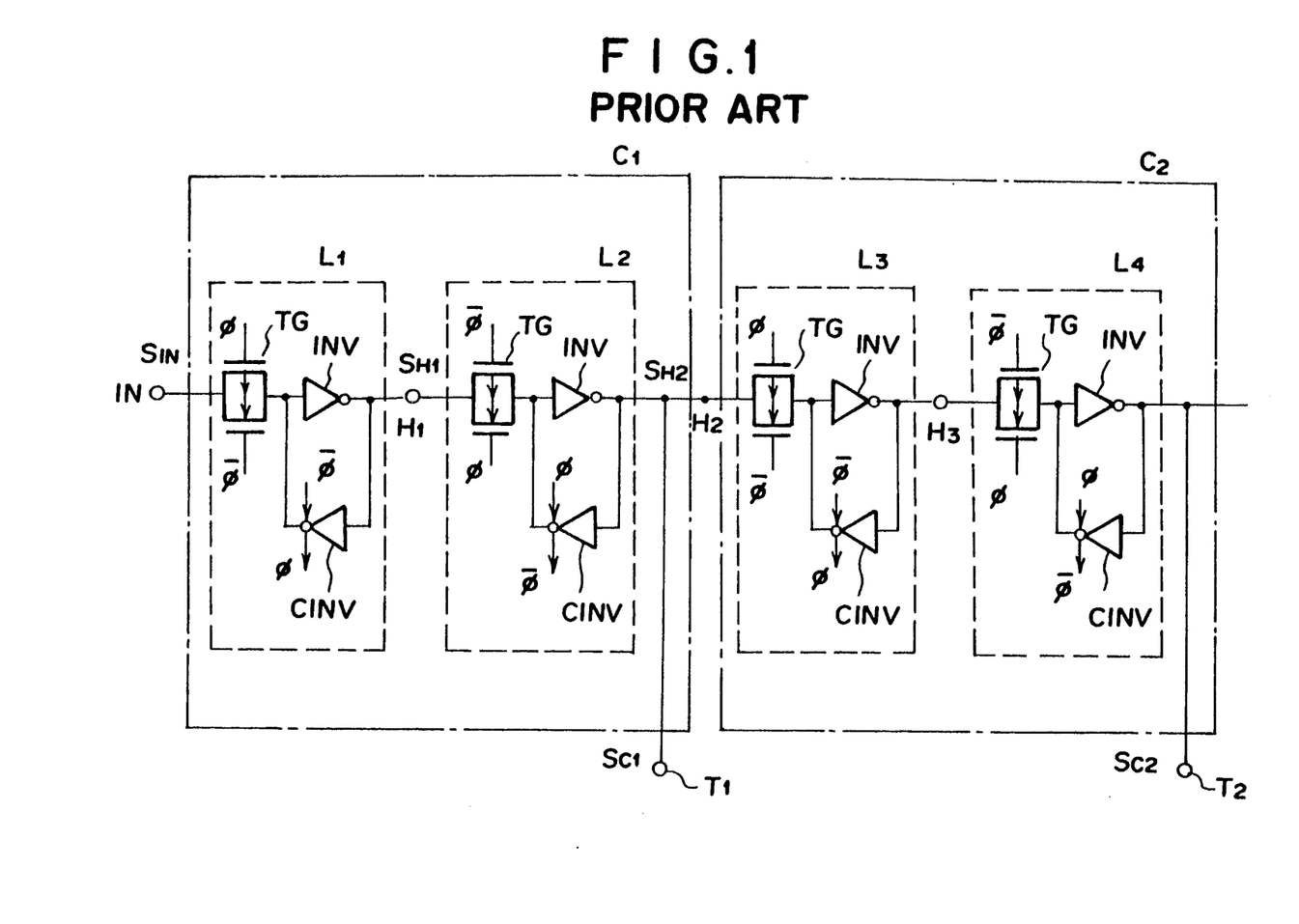
FIG. 1 is a circuit diagram of a typical and conventional shift register circuit.

The conventional shift register circuit of FIG. 1 comprises:
- a first latch portion $L_1$ in which one terminal of a transfer gate TG is connected to an input terminal IN, another terminal thereof is connected to an input terminal of an inverter INV which is connected in anti-parallel with a clocked inverter CINV, and an output terminal of the inverter INV is connected to a first cascade output terminal $H_1$; and
- a second latch portion $L_2$ which has the same configuration as the first latch portion $L_1$ but in which clock signals $\phi$, $\bar{\phi}$ inputted to a transfer gate TG and to a clocked inverter CINV are anti-phase to clock signals $\phi$, $\bar{\phi}$ inputted to those in the first latch portion $L_1$, the first latch portion $L_1$ and the second latch portion $L_2$ being cascade-connected.

Figure 2:
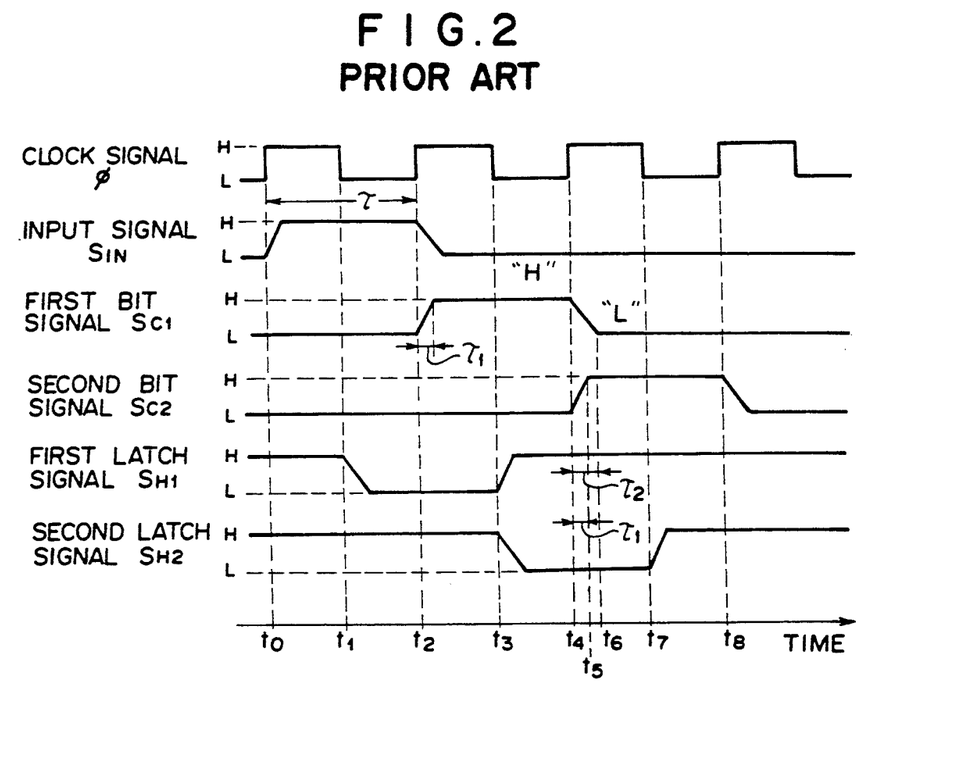
FIG. 2 shows a timing chart of signals illustrating the operation of the conventional shift register circuit shown in FIG. 1.

A clock signal $\phi$ and an input signal $S_{IN}$ are inputted, with the timing shown in FIG. 2, to a circuit which has two shift register circuits $C_1$, $C_2$ having the constitution mentioned above and having a cascade connection.

Now, operation of the shift register circuit $C_1$ will be explained.

In the time span between the time $t_0$ and $t_1$, the transfer gate TG turns off so that the input signal $S_{IN}$ of a high level "H" is not inputted to the first latch portion $L_1$.

In the time span between the time $t_1$ and $t_2$, the transfer gate TG of the first latch portion $L_1$ turns on and the input signal $S_{IN}$ of a high level "H" is now inputted to the first latch portion $L_1$ so that a first cascade signal $S_{H1}$ of a low level is outputted as a latch signal to the cascade output terminal $H_1$.

In the time span between the time $t_2$ and the time $t_3$, the transfer gate TG of the first latch portion $L_1$ turns off and the clocked inverter CINV thereof turns on so that the first cascade signal $S_{H1}$ of a low level "L" is maintained. At this time, the transfer gate TG of the second latch portion $L_2$ turns on and the signal $S_{H1}$ of a low level "L" is inputted to the second latch portion $L_2$ so that an output signal $S_{C1}$ of a high level "H" is outputted to an output terminal $T_1$ of a first bit signal. It needs a period $\tau_1$ from the time $t_2$ that the output signal $S_{C1}$ changes from a "L" level to a "H" level.

In the time span between the time $t_3$ and the time $t_4$, the transfer gate TG of the first latch portion $L_1$ turns on and, the input signal $S_{IN}$ of a low level "L" is inputted to the first latch portion $L_1$ so that the first cascade signal $S_{H1}$ of a high level "H" is outputted. And, the transfer gate TG of the second latch portion $L_2$ turns off and the clocked inverter CINV thereof turns on so that the ouput signal $S_{C1}$ of a high level "H" is maintained.

In the time span between the time $t_4$ and the time $t_7$, the transfer gate TG of the first latch portion $L_1$ turns off and the clocked inverter CINV thereof turns on so that the first cascade signal $S_{H1}$ of a high level "H" is maintained. And, the transfer gate TG of the second latch portion $L_2$ turns off and the signal $S_{H1}$ of a "H" level is inputted to the second latch portion $L_2$ so that the signal $S_{C1}$ of a low level "L" is outputted. It needs a period $\tau_2$ from the time $t_4$ that the output signal $S_{C1}$ changes from a "H" level to a "H" level.

As mentioned above, the input signal $S_{IN}$ of a high level "H" in the time span between the time $t_0$ and the time $t_2$ is shifted by one period $\tau$ of the clock signal and is outputted as the first bit signal $S_{C1}$ of a high level "H" from the shift register circuit $C_1$ in the period between the time $t_2$ and $t_4$.

The shift register circuit $C_2$ operates in a way similar to the shift register circuit $C_1$, and outputs a second bit signal $S_{C2}$ after the rise time $\tau_1$ in a period between the time $t_4$ and $t_8$.

As explained above, the conventional shift register circuit shifts data to the next shift register circuit every one period $\tau$ of the clock signal. And, there exist the periods $\tau_1$ and $\tau_2$ in which the bit signals outputted by the shift register circuits neighboring to each other become simultaneously an intermediate value between a "H" level and a "L" level.

In the conventional shift register circuit mentioned above, a change of each bit value synchronizes with each rising timing of the clock signal $\phi$ and, therefore, has a disadvantage in that one shift register having two latch portions can generate only one bit output. This means that a number of elements are needed for the circuit and a shifting speed of the circuit is slow.

In the conventional shift register circuit mentioned above, there exists a transient period where output signals by the bits neighboring to each other become an intermediate value which is not a "H" level nor a "L" level, which results in malfunction of the circuit.

Figure 3:
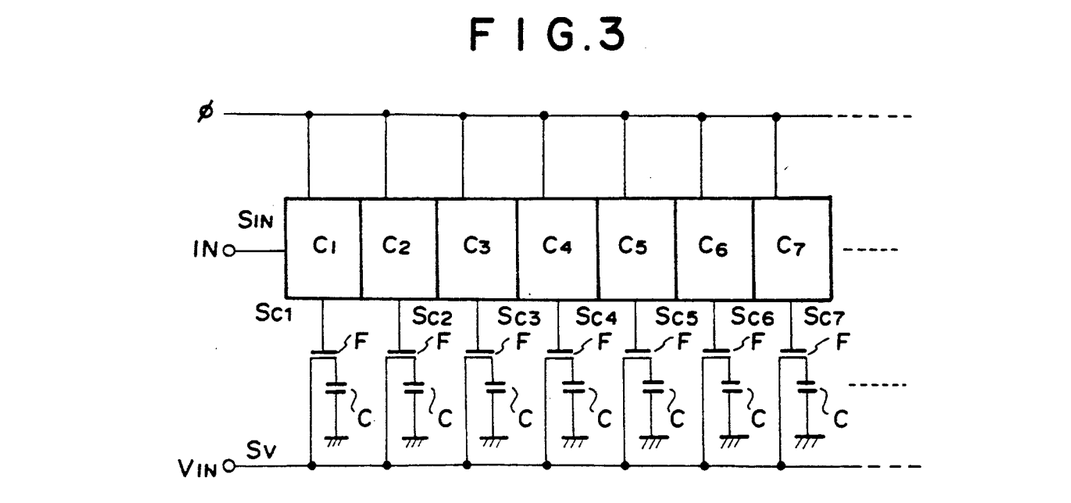
FIG. 3 is a circuit diagram of a sample hold circuit using conventional shift register circuits.

FIG. 3 is a circuit diagram of a sample hold circuit using conventional shift register circuits. The problem therein will be explained hereinafter.

In FIG. 3, bit signals outputted by a scanning portion comprising a plurality of shift register circuits $C_1$–$C_7$ are inputted to gates of FET switches F, respectively. Video signals $S_v$ are inputted commonly to sources of the FET switches F. Hold condensers are connected to drains thereof.

In this sample hold circuit, the input signal $S_{IN}$ and the clock signal which are shown in FIG. 2 are inputted to the shift register circuits $C_1$–$C_7$ so that FET switches F turn on/off successively. Each hold condenser C holds the video signal inputted in a period when each FET switch F turns on.

When the bit signals neighboring to each other outputted by the shift register circuits $C_1$–$C_7$ become intermediate values simultaneously, the two FET switches F neighboring to each other turn on. Therefore, the wave form of the video signal is not held correctly resulting in malfunction of the circuit.

Now, the embodiments of present invention will be described in detail hereinafter with reference to FIGS. 4 to 8.

Figure 4:
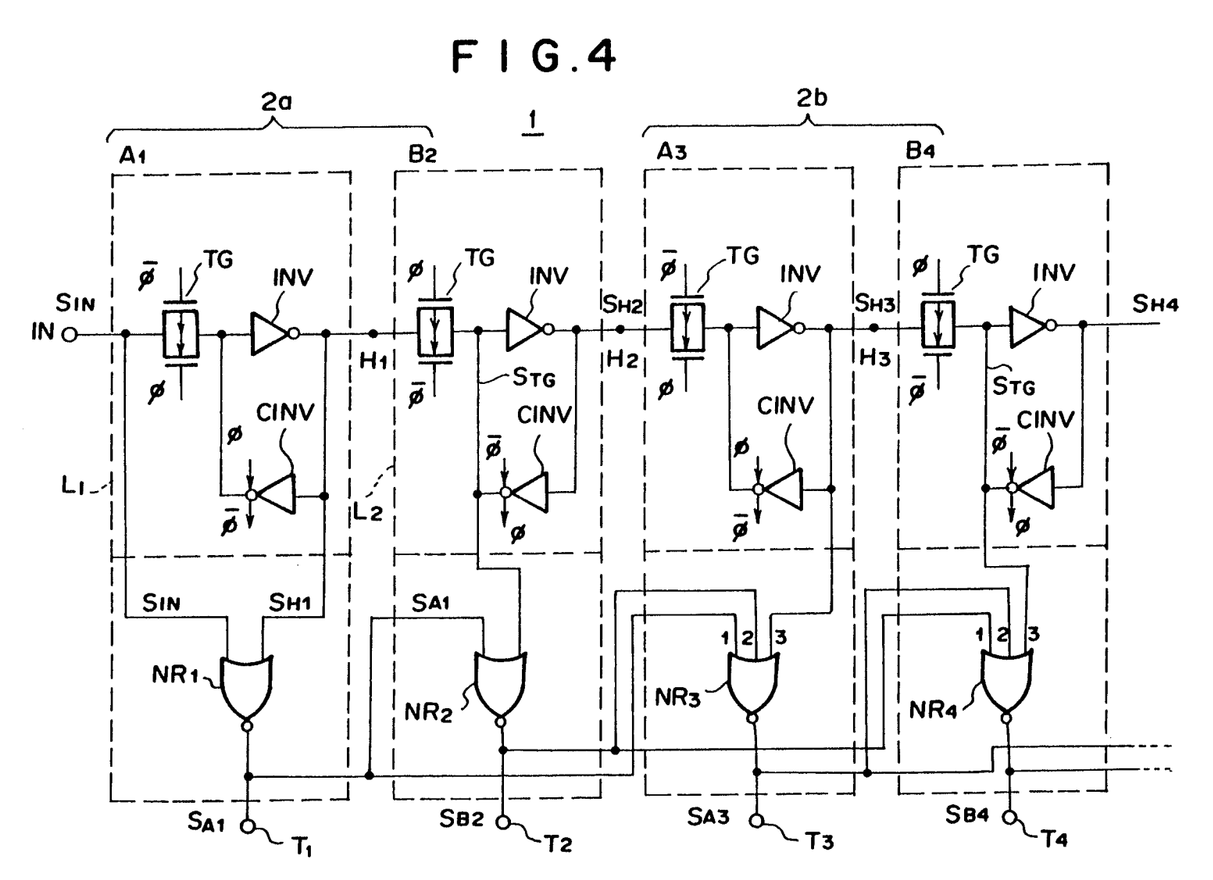
FIG. 4 is a circuit diagram of a shift register circuit as a first embodiment according to the present invention.

FIG. 4 shows a circuit diagram of a shift register circuit 1 as a first embodiment according to the present invention.

The circuit 1 of this first embodiment is an example of a 4-bit shift register circuit and comprises: a first 2-bit shift register circuit $2_a$ which includes first and second bit sections $A_1$ and $B_2$ connected in series with each other, and a second 2-bit shift register circuit $2_b$ which includes third and fourth bit sections $A_3$ and $B_4$ connected in series with each other, wherein the first 2-bit shift register circuit $2_a$ is connected with the second 2-bit shift register circuit $2_b$ through a second cascade output terminal $H_2$.

The first 2-bit shift register circuit $2_a$ comprises the first bit section $A_1$ and the second bit section $B_2$ which are connected with each other through a first cascade output terminal $H_1$. In the first bit section $A_1$, a NOR gate $NR_1$ having two input terminals is added to a first latch portion $L_1$ of a conventional shift register circuit $C_1$ shown in FIG. 1. The NOR gate $NR_1$ takes a logical NOR of an input signal $S_{IN}$ and a first cascade signal $S_{H1}$, and outputs the NOR signal as a first bit signal $S_{A1}$ to a first bit output terminal $T_1$. In the second bit section $B_2$, a NOR gate $NR_2$ having two input terminals is added to a second latch portion $L_2$ of a conventional shift register circuit $C_1$ shown in FIG. 1. The NOR gate $NR_2$ takes a logical NOR of the first bit signal $S_{A1}$ and a transfer output signal $S_{TG}$, and outputs the NOR signal as a second bit signal $S_{B2}$ to a second bit output terminal $T_2$.

The 2-bit shift register circuit $2_b$ comprises the third bit section $A_3$ and the fourth bit section $B_4$ which are cascade-connected with each other. In the third bit section $A_3$ and the fourth bit section $B_4$, NOR gates $NR_3$ and $NR_4$ having three input terminals are placed instead of the NOR gates $NR_1$ and $NR_2$ in the first and second bit sections $A_1$, $B_2$ of the 2-bit shift register circuit $2_a$, respectively.

Figure 5:
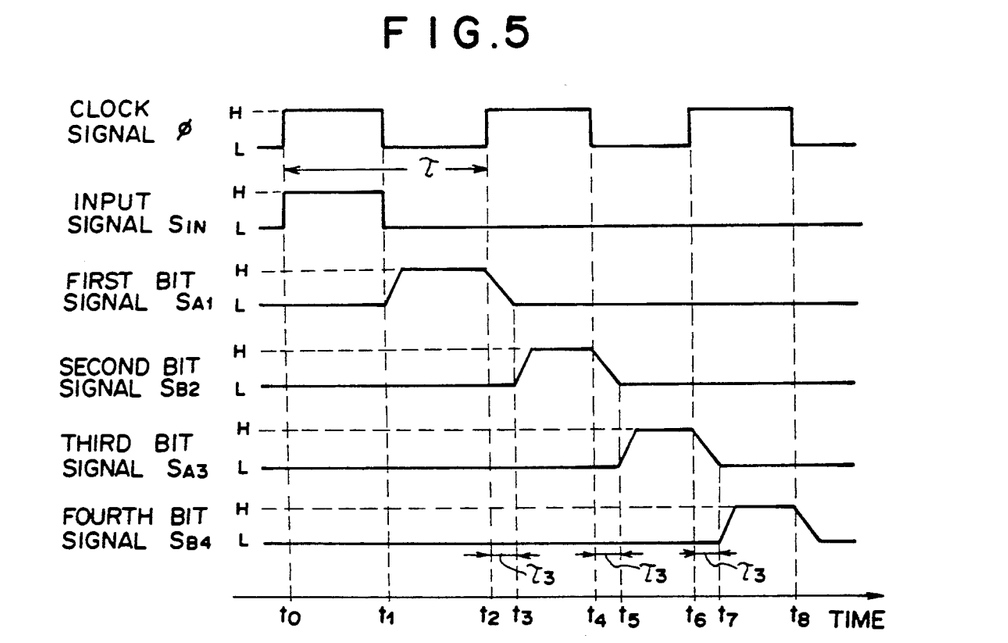
FIG. 5 shows a timing chart of signals illustrating the operation of the shift register circuit shown in FIG. 4 according to the present invention.

FIG. 5 is a timing chart which explains an operation of the shift register circuit as the first embodiment shown in FIG. 4 according to the present invention.

In the time span between the time $t_0$ and the time $t_1$ in which a clock signal $\phi$ is of a high level "H", a transfer gate TG of the first bit section $A_1$ turns on so that an input signal $S_{IN}$ of a high level "H" is, through an inverter INV, inputted as a signal of a low level "L" to one input terminal of the NOR gate $NR_1$. The high level signal "H" of the input signal $S_1$ is inputted to the other input terminal thereof so that the NOR gate $NR_1$ outputs a bit signal $S_{A1}$ of a low level "L".

In the time span between the time $t_1$ and the time $t_2$ in which a clock signal $\phi$ is of a low level "L", the transfer gate TG of the first bit section $A_1$ turns off and a clocked inverter CINV turns on so that the output signal of the inverter INV maintains the low level "L" and is inputted to the one input terminal of the NOR gate $NR_1$.

The low level signal "L" of the input signal $S_1$ is inputted to the other input terminal thereof so that the NOR gate $NR_1$ outputs a high level signal "H" as the bit signal $S_{A1}$.

And, a transfer gate TG of the second bit section $B_2$ turns on so that the first bit signal $S_{H1}$ of a low level "L" outputted by the inverter INV of the first bit section $A_1$ is inputted, as a transfer output signal $S_{TG}$, to one input terminal of the NOR gate $NR_2$.

The bit signal $S_{A1}$ outputted by the first bit section $A_1$ is inputted to the other input terminal of the NOR gate $NR_2$. But, because this bit signal $S_{A1}$ is not in a low level "L", a second bit signal $S_{B2}$ outputted by the second bit section $B_2$ becomes a low level "L".

In the period $\tau_3$ between the time $t_2$ and the time $t_3$ in which the clock signal $\phi$ is a high level "H", the transfer gate TG of the first bit section $A_1$ turns on so that an input signal $S_{IN}$ of a low level is, through the inverter INV, inputted as a signal of a high level "H" to the one input terminal of the NOR gate $NR_1$. The output signal $S_{A1}$ of the NOR gate $NR_1$, therefore, starts to change from a "H" level to a "L" level.

In the second bit section $B_2$, the transfer gate TG thereof turns off and a clocked inverter CINV turns on so that the output of the inverter INV maintains a high level "H", and a low level "L" signal is inputted to the one input terminal of the NOR gate $NR_2$.

The signal $S_{A1}$ which is not a "L" level is inputted to the other input terminal of the NOR gate $NR_2$ so that the NOR gate $NR_2$ outputs a low level signal "L" as the second bit signal $S_{B2}$.

Next, in the third bit section $A_3$ as a first section of the 2-bit shift register circuit $2_b$, a transfer gate TG thereof turns off so that a second cascade signal $S_{H2}$ of a high level "H" which is outputted by the inverter INV of the second bit section $B_2$ is inputted, through an inverter INV of this third bit section, as a low level signal "L" to a third input terminal of the NOR gate $NR_3$ having three input terminals.

Because the first bit signal $S_{A1}$ inputted to a first input terminal of the NOR gate $NR_3$ is not a "L" level, the NOR gate $NR_3$ outputs a third bit signal $S_{A3}$ of a low level "L".

In the time span between the time $t_3$ and the time $t_4$, the first bit section $A_1$ outputs the bit signal $S_{A1}$ of a low level "L" so that low level signals "L" are inputted to the two input terminals of the NOR gate $NR_2$ in the second bit section $B_2$ and, therefore, the NOR gate $NR_2$ therein outputs the second bit signal $S_{B2}$ of a high level "H".

In the third bit section $A_3$, the first bit signal $S_{A1}$ of a low level "L" is inputted to the first input terminal of the NOR gate $NR_3$. Because the second bit signal $S_{B2}$ inputted to the second input terminal of the NOR gate $NR_3$ is not a "L" level, the NOR gate $NR_3$ outputs a third bit signal $S_{A3}$ of a low level "L".

In the period $\tau_3$ between the time $t_4$ and $t_5$, the transfer gate TG of the second bit section $B_2$ turns on, and the output signal $S_{H1}$ of a high level "H" in the first bit section $A_1$ is inputted as the transfer output signal $S_{TG}$ of a high level "H" to the one input terminal of the NOR gate $NR_2$, so that the second bit signal $S_{B2}$ inputted to the NOR gate $NR_3$ starts to change from a "H" level to a "L" level.

In the third bit section $A_3$, the transfer gate TG thereof turns off and the clocked inverter CINV turns on so that the output level of the inverter INV is maintained, and a third cascade signal $S_{H3}$ of a low level "L" is inputted to the third input terminal of the NOR gate $NR_3$.

Because the bit signal $S_{B2}$ which is not "L" level is inputted to the second input terminal of the NOR gate $NR_3$, the NOR gate $NR_3$ outputs the bit signal $S_{A3}$ of a low level "L".

In the fourth bit section $B_4$, a transfer gate TG thereof turns on so that output signal $S_{H3}$ of a low level in the third bit section $A_3$ is inputted as a transfer output signal $S_{TG}$ of a low level "L" to a third input terminal of the NOR gate $NR_4$.

The second bit signal $S_{B2}$ which is not a "L" level is inputted to a first input terminal of the NOR gate $NR_4$ so that the NOR gate $NR_4$ outputs a signal of a low level "L".

In the time span between the time $t_5$ and the time $t_6$, the bit signal $S_{B2}$ of the second bit section $B_2$ becomes "L" level so that this second bit signal $S_{B2}$ of a low level is inputted to the second input terminal of the NOR gate $NR_3$ in the third bit section $A_3$.

The second bit signal $S_{B2}$ of a low level "L" is inputted to the first input terminal of the NOR gate $NR_4$ in the fourth bit section $B_4$, and the third bit signal $S_{A3}$ which is not a "L" level, so that the NOR gate $NR_4$ outputs a fourth bit signal $S_{B4}$ of a low level "L".

In the period $\tau_3$ between the time $t_6$ and time $t_7$, the transfer gate TG of the third bit section $A_3$ turns on. The second cascade signal $S_{H2}$ of a low level "L" in the second bit section $B_2$ is inputted, through the transfer gate TG and the inverter INV, as the third cascade signal $S_{H3}$ of a high level "H" to the third input terminal of the NOR gate $NR_3$ in the third bit section. Therefore, the third bit signal $S_{A3}$ outputted by the NOR gate $NR_3$ starts to change from a "H" level to a "L" level.

In the fourth bit section $B_4$, the transfer gate TG thereof turns off and clocked inverter CINV turns on so that the output level of the inverter INV is maintained, and the transfer output signal $S_{TG}$ of a low level "L" is inputted to the third input terminal of the NOR gate $NR_4$.

The second bit signal $S_{B2}$ which is not a "L" level is inputted to the first input terminal of the NOR gate $NR_4$ so that the NOR gate $NR_4$ outputs the fourth bit signal $S_{B4}$ of a low level "L".

In the time span between the time $t_7$ and the time $t_s$, the output signal $S_{A3}$ of the third bit section $A_3$ becomes a "L" level so that this third bit signal $S_{A3}$ of a low level "L" is inputted to the second input terminal of the NOR gate $NR_4$ in the fourth bit section $B_4$.

And, the second bit signal $S_{B2}$ of a low level "L" is inputted to the first input terminal of the NOR gate $NR_4$, and the transfer output signal $S_{TG}$ of a low level "L" is inputted to the third input terminal thereof, so that the NOR gate $NR_4$ outputs the fourth bit signal of a high level "H".

As explained above, the input signal $S_{IN}$ is shifted to the higher order bit section within half the period of the clock signal $\phi$, which means that the shifting speed is doubled as comparted with that in the conventional one.

Moreover, because a higher order bit section starts to output a signal after a lower order bit section outputs a low level signal "L", it does not happen that signals outputted by the bit sections neighboring to each other become simultaneously an intermediate value between a "H" level and a "L" level. Therefore, when the shift register circuit according to the present invention is applied to the sample hold circuit shown in FIG. 3 in which a plurality of 2-bit shift register circuits are cascade-connected, no substantial malfunction occurs and, moreover, the bit shifting speed thereof becomes two times higher as compared with the conventional one.

Where only 2-bit output is desired, it is possible to use the 2-bit shift register circuit $2_a$ having a simple constitution.

According to the shift register circuit of the present invention, as described above, the NOR gates are respectively added to the output terminals of the latch circuits which are connected in series in a conventional shift register circuit whereby 2-bit outputs can be obtained and a shifting speed can be made two times faster as compared with that in the conventional shift register circuit.

According to the present invention, moreover, because a higher order bit section starts to outputs a signal after the preceding lower order bit section outputs a low level signal "L", it is possible to avoid the signals outputted by the bit sections neighboring to each other becoming simultaneously intermediate values between a "H" level and a "L" level. Therefore, when the shift register circuit according to the present invention is applied to the sample hold circuit, this circuit can effectively hold waveforms of the signals inputted therein with stability.

Figure 6:
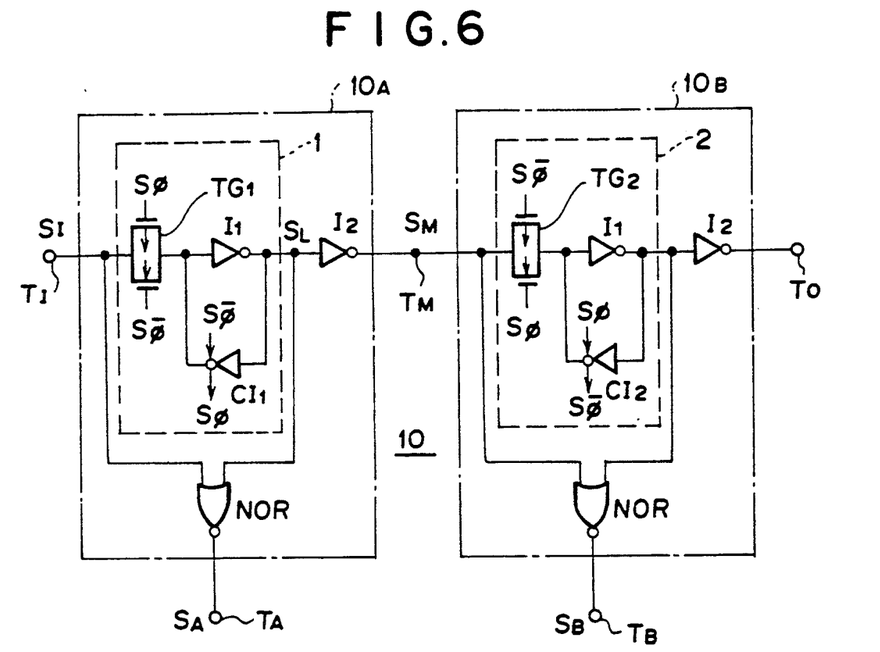
FIG. 6 is a circuit diagram of a shift register circuit as a second embodiment according to the present invention.

FIG. 6 shows a circuit diagram of a shift register circuit 10 as a second embodiment according to the present invention.

A shift register circuit 10 comprises two bit sections $10_A$, $10_B$ which have the same circuit configuration and have cascade connections through a cascade output terminal $T_M$ and in which clock signals $S\phi$, $\overline{S\phi}$ supplied to a transfer gate $TG_1$ and a clocked inverter $CI_1$ in a latch portion 1 of the bit section $10_A$ have an anti-phase relation to those supplied to a transfer gate $TG_2$ and a clocked inverter $CI_2$ in a latch portion 2 of the bit section $10_B$.

In the bit section $10_A$, the latch portion $L_2$ in the conventional shift register circuit $C_1$ shown in FIG. 1 is replaced with only an inverter $I_2$ and there is added a NOR gate NOR which takes a logical NOR of an input signal $S_I$ of the latch portion $L_1$ and a latch output signal $S_L$ and out puts a NOR signal as a first bit signal $S_A$ to a first bit terminal $T_A$.

Figure 7:
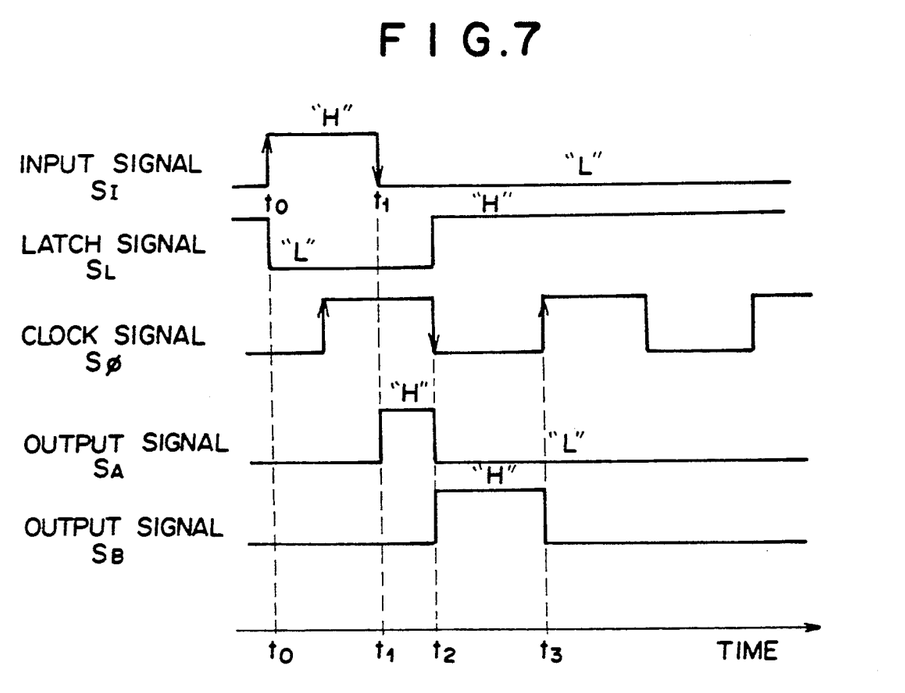
FIG. 7 shows a timing chart of signals illustrating the operation of the shift register circuit shown in FIG. 6 according to the present invention.

FIG. 7 shows a timing chart of signals which illustrates the operation of the shift register circuit as the second embodiment shown in FIG. 6 according to the present invention.

When the input signal $S_I$ and the clock signal $S\phi$ are inputted to the shift register circuit 10 shown in FIG. 6, the latch signal $S_L$ outputted by the latch portion 1 becomes a low level "L" from the rising timing $t_0$ of the input signal $S_I$. The clock signal $S\phi$ is a high level "H" at the falling timing $t_1$ when the input signal $S_I$ changes from a high level "H" into a low level "L". Therefore, the output signal $S_A$ of the bit section $10_A$ becomes a high level "H".

At the time $t_2$ when the clock signal $S\phi$ changes from a high level "H" to a low level "L", the latch signal $S_L$ becomes a high level "H" so that a cascade signal $S_M$ inputted to the bit section $10_B$ becomes an inverted signal of the latch signal $S_L$.

At the time $t_2$, therefore, an output signal $S_B$ of the bit section $10_B$ becomes a high level "H" and maintains its level to the next rising timing $t_3$ of the clock signal $S\phi$.

In the shift register circuit 10 as the second embodiment according to the present invention, as mentioned above and shown in FIG. 6, data are transmitted to a higher order bit section, i.e. from the bit section $10_A$ to the next bit section $10_B$ not only at the rising timing $t_1$ of the clock signal $S\phi$ but also at the falling timing $t_2$ thereof.

Therefore, when a plurality of shift register circuits 10 according to the present invention are cascade-connected similarly as the sample hold circuit shown in FIG. 3, data are transmitted to higher order bit portions synchronously with the rising timing and the falling timing, which means that the transmission occurs every half of the period of the clock signal $S\phi$. Thus, the shifting speed thereof is doubled as compared with that in a circuit using conventional shift register circuits shown in FIG. 1 on the condition that the clock signals $S\phi$ of both circuits have the same frequency.

In the shift register circuit 10 shown in FIG. 6, the number of elements therein is fourteen (14) per bit, and is two (2) less than the number of sixteen (16) in the conventional shift register circuit shown in FIG. 1. In this connection, the respective elements in the shift register circuit 10 are counted such that the inverter, the clocked inverter, the two-input NOR gate and the transfer gate are two (2), four (4), four (4), and two (2), respectively.

Figure 8:
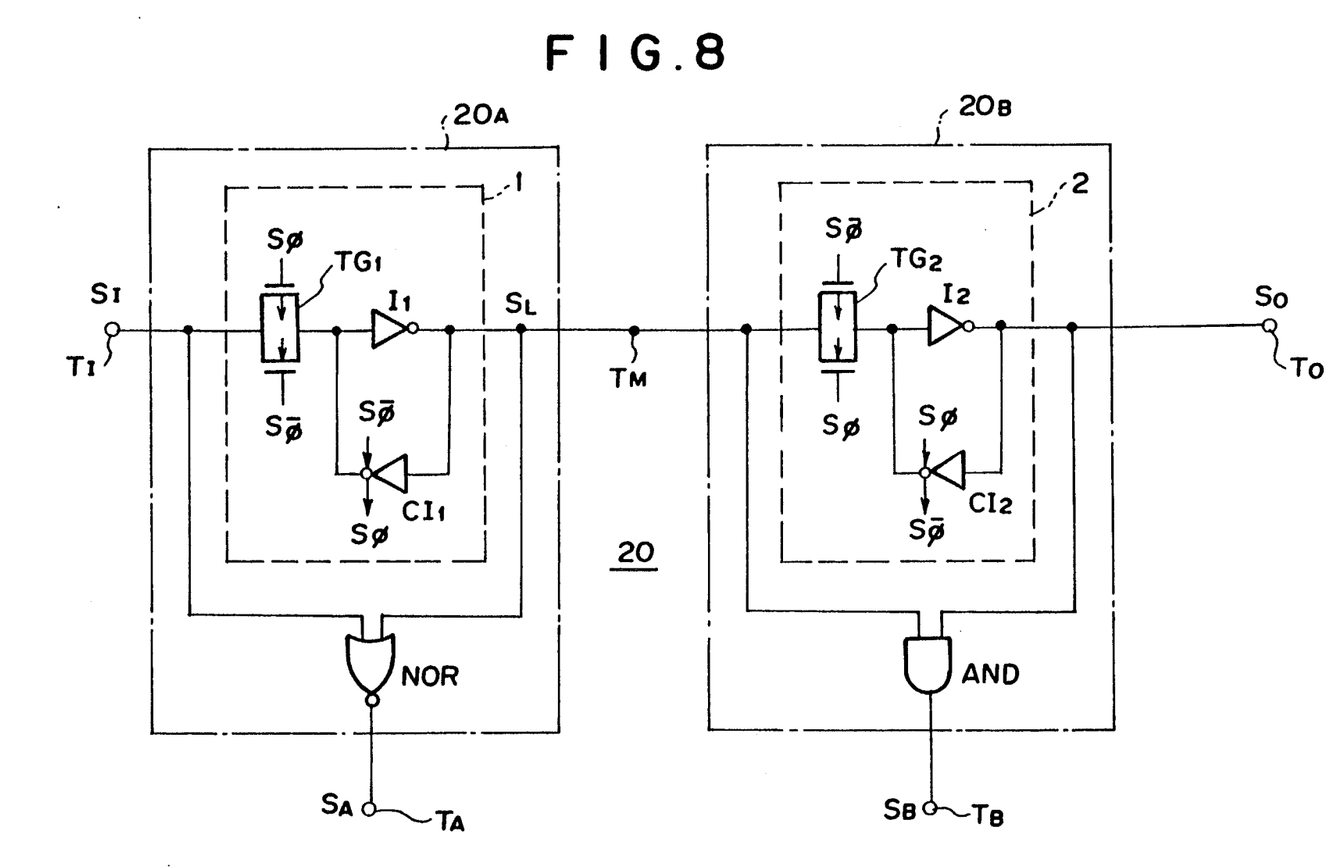
FIG. 8 is a circuit diagram of a shift register circuit as third embodiment according to the present invention.

FIG. 8 shows a circuit diagram of a shift register circuit 20 as a third embodiment according to the present invention.

A shift register circuit 20 comprises two bit sections $20_A$, $20_B$ which have cascade connection through a cascade output terminal $T_M$ and in which clock signals $S\phi$, $\overline{S\phi}$ supplied to a transfer gate $TG_1$ and a clocked inverter $CI_1$ in a latch portion 1 of the bit section $20_A$ have anti-phase relation to those supplied to a transfer gate $TG_2$ and a clocked inverter $CI_2$ in a latch portion 2 of the bit section $20_B$.

In the bit section $20_A$, the inverter $I_2$ of the bit section $10_A$ shown in FIG. 6 is omitted.

In the bit section $20_B$, the inverter $I_2$ of the bit section $10_B$ shown in FIG. 6 is omitted and the NOR-gate thereof is replaced with an AND-gate.

The operation of the shift register circuit 20 shown in FIG. 8 is similar to that of the embodiment shown in FIG. 6. The number of elements therein is, however, 26 per 2 bits, and is less than the number of 32 in the conventional shift register circuit or the number of 28 in the second embodiment.

According to the shift register circuit of the present invention, there are cascade-connected the bit sections each of which takes a logical operation of the input and output signals of the latch portion and outputs its results as a bit signal. The data inputted are shifted with 2-bits in every period of clock signal φ so that a shifting speed thereof becomes two times faster than that in the conventional shift register circuit.

Moreover, the shift register circuit of the present invention has an advantage in that the number of elements per bit can be reduced.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A shift register circuit comprising:
   a first bit section including a first latch portion which outputs a first cascade signal, and including a first NOR gate which takes a logical NOR of an input signal inputted to one terminal thereof and said first cascade signal inputted to another terminal thereof, and which outputs a NOR signal as a first bit signal;
   a second bit section including a second latch portion which receives said first cascade signal from said first latch portion and outputs a second cascade signal, and including a second NOR gate which takes a logical NOR of said first bit signal inputted to one terminal thereof and a transfer output signal outputted from said second latch portion and inputted to another terminal thereof, and which outputs a NOR signal as a second bit signal; and
   a third bit section including a third latch portion which receives said second cascade signal from said second latch portion and outputs a third cascade signal, and including a third NOR gate which takes a logical NOR of said first bit signal inputted to a first terminal thereof, said second bit signal inputted to a second terminal thereof and said third cascade signal inputted to a third terminal thereof, and which outputs a NOR signal as a third bit signal.

2. A shift register circuit comprising:
   a first bit section including a first latch portion which has a first transfer gate wherein an input signal is inputted to one terminal of said first transfer gate and has a first inverter and a first clocked inverter, said first inverter and said first clock inverter forming a first anti-parallel circuit, wherein an input terminal of said first inverter is connected to another terminal of said first transfer gate, and which outputs a first cascade signal, and including a first NOR gate which takes a logical NOR of said input signal inputted to one terminal thereof and said first cascade signal inputted to another terminal thereof, and which outputs a NOR signal as a first bit signal; and
   a second bit section including a second latch portion which has a second transfer gate wherein said first cascade signal is inputted to one terminal of said second transfer gate and has a second inverter and a second clocked inverter, said second inverter and said second clocked inverter forming a second anti-parallel circuit, wherein an input terminal of said second inverter is connected to another terminal of said second transfer gate, and which outputs a second cascade signal, and including a second NOR gate which takes a logical NOR of said first bit signal inputted to one terminal thereof and a transfer output signal outputted from second transfer gate and inputted to another terminal thereof, and which outputs a NOR signal as a second bit signal,
   said second transfer gate and said second clocked inverter in said second latch portion being supplied with a clock signal having anti-phase relation to a clock signal supplied to said first transfer gate and said first clocked inverter in said first latch portion.

3. A shift register circuit comprising:
   a first bit section including a first latch portion which has a first transfer gate wherein an input signal is inputted to one terminal of said first transfer gate and has a first inverter and a first clocked inverter, said first inverter and said first clocked inverter forming a first anti-parallel circuit, wherein an input terminal of said first inverter is connected to another terminal of said first transfer gate, and which outputs a first cascade signal, and including a first NOR gate which it takes a logical NOR of said input signal inputted to one terminal thereof and said first cascade signal inputted to another terminal thereof, and which outputs a NOR signal as a first bit signal;
   a second bit section including a second latch portion which has a second transfer gate wherein said first cascade signal is inputted to one terminal of said second transfer gate and has a second inverter and a second clocked inverter, said second inverter and said second clocked inverter forming a second anti-parallel circuit, wherein an input terminal of said second inverter is connected to another terminal of said second transfer gate, and which outputs a second cascade signal, and including a second NOR gate which takes a logical NOR of said first bit signal inputted to one terminal thereof and a transfer output signal outputted from said second transfer gate and inputted to another terminal thereof, and which outputs a NOR signal as a second bit signal,
   said second transfer gate and said second clocked inverter in said second latch portion being supplied with a clock signal having anti-phase relation to a clock signal supplied to said first transfer gate and said first clocked inverter in said first latch portion; and
   a third bit section including a third latch portion which has a third transfer gate wherein said second cascade signal is inputted to one terminal of said third transfer gate and has a third inverter and a third clocked inverter, said third inverter and said clocked inverter forming a third anti-parallel circuit, wherein an input terminal of said third inverter is connected to another terminal of said third transfer gate, and which outputs a third cascade signal, and including a third NOR gate which takes a logical NOR of said first bit signal inputted to a first terminal thereof, said second bit signal inputted to a second terminal thereof and said third cascade signal inputted to a third terminal thereof, and which outputs a NOR signal as a third bit signal,
   said third transfer gate and said third clocked inverter in said third latch portion being supplied with a clock signal having the same phase relation to a clock signal supplied to said first transfer gate and said first clocked inverter in said first latch portion.

4. A shift register circuit comprising:

a first bit section including a first latch portion which outputs a first latch signal, including a first NOR gate which takes a logical NOR of an input signal inputted to one terminal thereof and said first latch signal inputted to another terminal thereof, and which outputs a NOR signal as a first bit signal, and including a first cascade output terminal which outputs an inverted signal of said first latch signal as a first cascade signal; and a second bit section including a second latch portion which outputs a second latch signal, and including a second NOR gate which takes a logical NOR of said first cascade signal inputted to one terminal thereof and said second latch signal inputted to another terminal thereof, and which outputs the NOR signal as a second bit signal.

5. A shift register circuit comprising:

a first bit section including a first latch portion which has a first transfer gate wherein an input signal is inputted to one terminal of said first transfer gate and has a first inverter and a first clocked inverter, said first inverter and said first clocked inverter forming a first anti-parallel circuit, wherein an input terminal of said first inverter is connected to another terminal of said first transfer gate, and which outputs a first latch signal, including a first NOR gate which takes a logical NOR of said input signal inputted to one terminal thereof and said first latch signal inputted to another terminal thereof, and which outputs a NOR signal as a first bit signal, and including a first cascade output terminal which outputs an inverted signal of said first latch signal as a first cascade signal; and a second bit section including a second latch portion which has a second transfer gate wherein said first cascade signal is inputted to one terminal of said second transfer gate and has a second inverter and a second clocked inverter, said second inverter and said second clocked inverter forming a second anti-parallel circuit, wherein an input terminal of said second inverter is connected to another terminal of said second transfer gate, and which outputs a second latch signal, and including a second NOR gate which takes a logical NOR of said first cascade signal inputted to one terminal thereof and said second latch signal inputted to another terminal thereof, and which outputs the NOR signal as a second bit signal, said second transfer gate and said second clocked inverter in said second latch portion being supplied with a clock signal having anti-phase relation to a clock signal supplied to said first transfer gate and said first clocked inverter in said first latch portion.

6. A shift register circuit according to claim 4, wherein said second bit section further includes a second cascade output terminal which outputs an inverted signal of said second latch signal as a second cascade signal.

7. A shift register circuit comprising:

a first bit section including a first latch portion which outputs a first latch signal, including a first NOR gate which takes a logical NOR of an input signal inputted to one terminal thereof and said first latch signal inputted to another terminal thereof, and which outputs a NOR signal as a first bit signal, and including a first cascade output terminal which outputs said first latch signal as a first cascade signal; and a second bit section including a second latch portion which outputs a second latch signal, and including an AND gate which takes a logical AND of said first cascade signal inputted to one terminal thereof and said second latch signal inputted to another terminal thereof, and which outputs an AND signal as a second bit signal.

8. A shift register circuit comprising:

a first bit section including a first latch portion which has a first transfer gate wherein an input signal is inputted to one terminal of said first transfer gate and has a first anti-parallel circuit formed by a first inverter and a first clocked inverter wherein an input terminal of said first inverter is connected to another terminal of said first transfer gate, and which outputs a first latch signal, including a first NOR gate which takes a logical NOR of said input signal inputted to one terminal thereof and said first latch signal inputted to another terminal thereof, and which outputs a NOR signal as a first bit signal, and including a first cascade output terminal which outputs said first latch signal as a first cascade signal; and a second bit section including a second latch portion which has a second transfer gate wherein said first cascade signal is inputted to one terminal of said second transfer gate and has a second inverter and a second clocked inverter, said second inverter and said second clocked inverter forming a second anti-parallel circuit, wherein an input terminal of said second inverter is connected to another terminal of said second transfer gate, and which outputs a second latch signal, and including an AND gate which takes a logical AND of said first cascade signal inputted to one terminal thereof and said second latch signal inputted to another terminal thereof, and which outputs an AND signal as a second bit signal, said second transfer gate and said second clocked inverter in said second latch portion being supplied with a clock signal having anti-phase relation to a clock signal supplied to said first transfer gate and said first clocked inverter in said first latch portion.

9. A shift register circuit according to claim 2, wherein said second bit section further comprises a second cascade output terminal which outputs said second latch signal as said second cascade signal.

* * * * *